United States Patent
Hao et al.

(10) Patent No.: US 6,756,291 B1
(45) Date of Patent: Jun. 29, 2004

(54) METHOD FOR HARDENING GATE OXIDES USING GATE ETCH PROCESS

(75) Inventors: Ching Chen Hao, Jubei (TW); Jing Chiang Chang, Hsinchu (TW); Nai-Chen Lu, Hsinchu (TW); Chao-Chi Chen, Dung Chiu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/350,604

(22) Filed: Jan. 24, 2003

(51) Int. Cl.⁷ ............................................... H01L 21/3205
(52) U.S. Cl. ..................... 438/586; 438/588; 438/655; 438/657; 438/663; 438/664
(58) Field of Search ................... 438/586, 588, 438/655, 657, 663–664

(56) References Cited

U.S. PATENT DOCUMENTS

| | | | |
|---|---|---|---|
| 5,135,608 A | * 8/1992 | Okutani | 438/584 |
| 6,191,463 B1 | * 2/2001 | Mitani et al. | 257/411 |
| 6,417,104 B1 | * 7/2002 | Hu | 438/682 |
| 6,537,910 B1 | * 3/2003 | Burke et al. | 438/680 |
| 2003/0139061 A1 | * 7/2003 | Jeng et al. | 438/775 |

* cited by examiner

Primary Examiner—Hsien Ming Lee
(74) Attorney, Agent, or Firm—Tung & Associates

(57) ABSTRACT

A method for repairing a damaged gate oxide layer while making the gate oxide layer resistant to gate oxide degradation including providing a silicon substrate having an overlying gate oxide layer and a polysilicon layer overlying the gate oxide layer; forming a polycide layer over the polysilicon layer; photolithographically patterning the polycide layer for dry etching a gate structure; dry etching a gate structure including etching through a thickness of the polycide layer including a fluorine containing etching chemistry to produce implanted fluorine in the polycide layer; and, thermally annealing the silicon substrate including the gate structure to thermally diffuse the implanted fluorine to an interface region of the gate oxide and the silicon substrate to form chemical bonds with silicon.

20 Claims, 2 Drawing Sheets

METHOD FOR HARDENING GATE OXIDES USING GATE ETCH PROCESS

FIELD OF THE INVENTION

The present invention relates generally to CMOS device fabrication processes and, more particularly, to a method of manufacturing gate structures having an improved resistance to hot carrier induced defects at the silicon/gate oxide interface thereby improving electrical properties including current voltage characteristics of an MOS transistor.

BACKGROUND OF THE INVENTION

Fabrication of a metal-oxide-semiconductor (MOS) integrated circuit involves numerous processing steps. A gate dielectric, typically formed from silicon dioxide, is formed on a semiconductor substrate which is doped with either n-type or p-type impurities. For each MOS field effect transistor (MOSFET) being formed, a gate electrode is formed over the gate dielectric, and dopant impurities are introduced into the semiconductor substrate to form source and drain regions. Many modern day semiconductor microelectronic fabrication processes form features having less than a 0.25 line width. As feature size decreases, the size of the resulting transistor as well as transistor features also decrease. Fabrication of smaller transistors allows more transistors to be placed on a single monolithic substrate, thereby allowing relatively large circuit systems to be incorporated on a single die area.

In semiconductor microelectronic device fabrication, polysilicon and silicon dioxide ($SiO_2$) are commonly used to respectively form gate electrodes and gate dielectrics for metal-oxide-semiconductor (MOS) transistors. As device dimensions have continued to scale down, the thickness of the $SiO_2$ gate dielectric layer has also decreased to maintain the same capacitance between the gate and channel regions. A problem with using $SiO_2$ as the gate dielectric is that thin $SiO_2$ oxide films tend to accumulate lattice damage in the gate oxide leading to degraded electrical performance. Frequently, during reliability testing, the gate structure including the gate electrode and gate oxide are subjected to high electric fields to induce hot carrier damage in the gate oxide to determine the reliability of the MOSFET devices.

For example, high stress voltage conditions are frequently created in the silicon substrate between the source and drain regions during device operation causing the charge carriers to gain sufficient energy to create impact-ionized electron-hole pairs, the charge carriers also referred to as hot carriers. A fraction of the hot carriers will have sufficient energy to overcome the silicon/gate oxide barrier and be injected into the gate oxide causing the creation of interface states and charge trapping states in the gate oxide. Such gate oxide damage causes a gradual degradation of the MOSFET's current-voltage characteristics. The degradation, for example, causes circuit switching characteristics and threshold voltages to change over time.

For example, one type of damage caused during hot carrier stressing, is the formation of interface states. For example, at the Si/SiO2 interface in an ideal interface region all the bonds are saturated, for example, bonded to another silicon atom, an oxygen atom, or a hydrogen atom. Hot carriers injected across the Si/SiO2 interface can cause the chemical bonds to break forming what are referred to as dangling bonds. Dangling bonds cause a disruption in the periodicity of the lattice and undesirably affect the electrical properties of the gate oxide. For example, an Si—H bond has a bonding energy of about 3.18 eV which is broken by a hot carrier having a greater energy. One effect of such interface state damage is the decrease of what is known as the sub-threshold voltage gradient.

Several approaches to hardening the gate oxide to resist hot carrier induced damage have included adding nitrogen to the gate oxide by a variety of processes including nitrogen implantation and nitridation of either the silicon or gate oxide ($SiO_2$) followed by annealing treatments to distribute the nitrogen to the Si—SiO interface. Nitrogen is believed to suppress hot carrier induced damage by becoming incorporated into the oxide at the $Si/SiO_2$ oxide interface. Several problems have emerged with doping the gate oxide with nitrogen including creating electron trapping states and decreasing the charge carrier mobility in the gate oxide.

Another approach has been to dope the gate oxide with fluorine. For example it is known that fluorine can form stronger bonds (e.g., 5.73 eV) compared to Si—O, Si—Si, or Si—H bonds, thereby resisting hot carrier induced damage. Fluorine, for example has been implanted by ion implantation into the polysilicon gate electrode followed by an annealing process to diffuse the fluorine into the gate oxide region. A problem with this approach is that the polysilicon gate electrode is typically additionally doped with, for example, boron or phosphorous, to adjust the polysilicon electrical properties. The addition of fluorine to the polysilicon has had the detrimental effect of increasing the diffusion of implanted species, for example, boron into the gate oxide and silicon substrate thereby detrimentally affecting MOS transistor electrical properties. Fluorine has also been implanted by ion implantation into the gate oxide followed by an annealing process. One problem with this approach is that the problem of boron penetration through the gate oxide is not alleviated. Another problem is the equipment intensive and time intensive nature of ion implantation.

Therefore it would be advantageous to develop an improved method for formation hot carrier hardened gate oxides where the gate oxide is better able to resist hot carrier induced defects to improve MOS device performance and reliability.

It is therefore an object of the invention to provide an improved method for formation hot carrier hardened gate oxides where the gate oxide is better able to resist hot carrier induced defects to improved MOS device performance and reliability while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for repairing a damaged gate oxide layer while making the gate oxide layer resistant to gate oxide degradation.

In a first embodiment, the method includes providing a silicon substrate having an overlying gate oxide layer and a polysilicon layer overlying the gate oxide layer; forming a polycide layer over the polysilicon layer; photolithographically patterning the polycide layer for dry etching a gate structure; dry etching a gate structure including etching through a thickness of the polycide layer including a fluorine containing etching chemistry to produce implanted fluorine in the polycide layer; and, thermally annealing the silicon substrate-including the gate structure to thermally diffuse the implanted fluorine to an interface region of the gate oxide and the silicon substrate to form chemical bonds with silicon.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the formation of an exemplary gate structure including a gate oxide, it will be appreciated that the method of the present invention may be adapted in general in the formation of any type of PMOS or NMOS device.

Figure 1A:
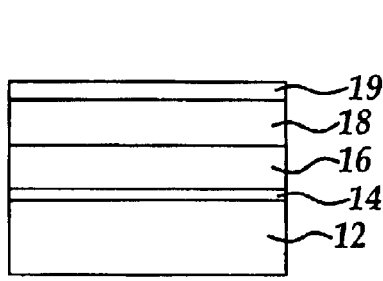
FIGS. 1A–1C are cross sectional side views of an exemplary CMOS transistor at stages in manufacture of a gate structure according to an exemplary implementation of an embodiment of the present invention.
Figure 1B:
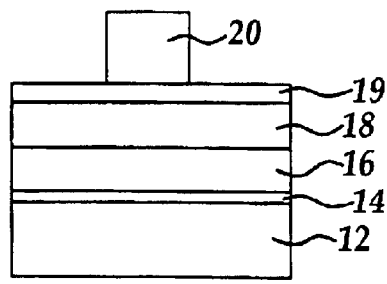
Figure 1C:
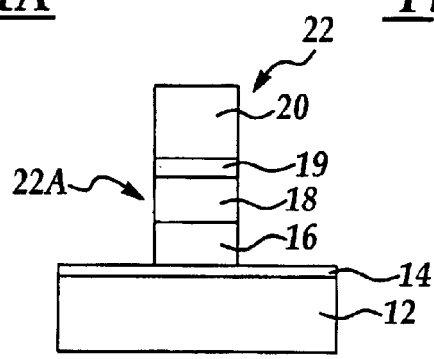

Referring to FIGS. 1A–1C in exemplary implementation of the method of the present invention, are shown cross-sectional side views of a portion of a semiconductor wafer during stages in production of an exemplary MOS transistor. For example, referring to FIG. 1A is shown a silicon substrate 12 which is typically n-doped and p-doped in prior processes to form n-wells and p-wells in forming, for example dual well CMOS structures. Formed over the silicon substrate 12 is a thermally grown $SiO_2$ gate oxide is layer 14, formed by a conventional annealing process in oxygen at about 850° C. to about 1150° C. For example, the gate oxide layer is preferably formed having a thickness of about 50 to 100 Angstroms, for example about 70 Angstroms. For example, the problem of the formation of hot carrier induced damage diminishes as the oxide layer gets thinner due to current tunneling effects. Overlying the gate oxide layer is formed a layer of polysilicon 16 formed by a conventional CVD process, for example LPCVD, to form a polysilicon layer having a thickness of about 1200 Angstroms to about 3000 Angstroms, for example about 1500 Angstroms.

Still referring to FIG. 1A, the polysilicon layer 16, the polysilicon layer is optionally doped by a conventional ion implantation or chemical process with, for example, phosphorous, to reduce a sheet resistance of the polysilicon. Following formation the polysilicon layer 16, according to one aspect of the present invention, a polycide layer 18 is formed to further reduce the gate resistance, for example to about 1–3 ohms/square a unit commonly used in the semiconductor manufacture art. Preferably a tungsten silicide layer, for example $WSi_x$ where x is about 2.2 to about 2.6, is formed over the polysilicon layer having a thickness of about 1000 to about 1500 Angstroms, for example about 1300 Angstroms. It will be appreciated that other refractory silicides including, for example, tantalum silicide and molybdenum silicide may be suitably used to form the polycide layer 18. Tungsten silicide is preferred however due to the relative ease of obtaining a high purity film by CVD deposition and superior penetration by fluorine in a subsequent gate etching process which is an important aspect of the invention. For example the tungsten silicide is deposited by a LPCVD process at a temperature of about 300° C. to about 400° C. followed by an RTP process at about 900° C.

Still referring to FIG. 1A, preferably formed over the polycide layer 18 is a TEOS oxide (e.g., $SiO_2$) layer 19 formed by a PECVD process to form an oxide layer having a thickness of about 100 Angstroms to about 300 Angstroms, for example about 200 Angstroms. The TEOS oxide layer functions as a hard mask during the gate etching process to maintain a consistent gate etching profile.

Referring to FIG. 1B, a conventional photolithographic patterning process is carried out to pattern a photoresist layer 20 over the polysilicon gate structure for carrying out a reactive ion etch (RIE) process. It is important to etch the gate structure with a well controlled profile, for example, substantially vertical sidewalls to control a gate length. For example the channel width of the device depends on the width (gate length) of the gate structure which in turn depends on the width of the patterned photoresist layer 20 and the etching chemistry etching selectivity to achieve substantially vertical gate sidewalls.

Referring to FIG. 1C, following patterning the gate structure, a dry etching process, for example a reactive ion etch (RIE) process is carried out to etch the gate structure including etching through the oxide hard mask 19, the polycide layer 18, and the polysilicon layer 16 to expose the gate oxide layer 14 and for gate structure 22. For example, the etching process may include a multiple step etching process where etching chemistries are changed or varied for etching through the various layers. In one embodiment, the dry etching process includes etching through at least a portion of the thickness of the polycide layer 18 using a fluorine containing etching chemistry. Preferably, the fluorine in the fluorine containing etching chemistry is supplied by one or more fluorine containing gases including, for example, $CF_4$, $C2F_6$, and $SF_6$. The fluorine containing etching chemistry also preferably includes chlorine gases including, for example, $Cl_2$, $CCl_4$, $SiCl_4$, and $CHCl_3$. The fluorine containing etching chemistry is preferably supplied by plasma gas source gases to form a plasma forming gas mixture including individually fed gases or pre-mixed gases to form a plasma forming gas mixture having a stoichiometric ratio of Cl to F of about 3 to 2 to about 2 to 1. The stoichiometric ratio of Cl to F is important since excessive F will lead to undesirable etching of the polysilicon, for example by undercutting of the polysilicon portion of the gate structure and undesirably changing the gate profile and therefore the gate length of the gate structure. On the other hand, insufficient F will not provide sufficient fluorine to form a sufficiently doped (hardened) gate oxide. Preferably, the temperature of the wafer during etching is maintained at about 50° C. to about 80° C. and carried out at a pressure of about 1 milliTorr to about 20 milliTorr.

In another embodiment, the fluorine is eliminated from the etching chemistry following etching through a thickness portion of the polycide layer 18. For example, by continuing the etching process of the polysilicon layer 16 without fluorine, the concern of undesirably over-etching the polysilicon portion of the gate oxide thereby undesirably affect the gate profile and the gate length is avoided.

Still referring to FIG. 1C is shown a gate structure following the dry etching process. In one embodiment of the present invention, during the dry etching process, fluorine atoms penetrate and are implanted in the polycide layer 18, preferably tungsten silicide. For example, in operation, during the dry etching process where a thickness portion of the polycide layer is removed exposing polycide layer sidewalls e.g., 22A, fluorine atoms penetrate and are implanted into the polycide layer through the exposed sidewalls, e.g., 22A, of the polycide layer portion of the gate structure 22.

Following the dry etching process to form the gate structure 22, the photoresist layer is stripped and a rapid thermal process (RTP) annealing process is carried out to anneal the semiconductor wafer including the gate structure at a temperature of about 900° C. to about 1000° C. for a period of about 15 seconds to about 90 seconds, more preferably at a temperature of about 980° C. for a period of about 30 seconds. It will be appreciated conventional thermal annealing processes may be used as well, for example, including annealing time periods of 10 minutes to about 60 minutes. In operation, during the annealing process the fluorine atoms are driven by thermally enhanced diffusion through the polysilicon portion of the gate, into the gate oxide portion and to the $SiO_2$/silicon interface. The fluorine atoms at the $SiO_2$/silicon interface form bonds with dangling bonds at the interface to eliminate interface states as well as replace less strongly bonded atoms to make the interface region more resistant to hot carrier induced damage. For example, the fluorine tends to replace atoms bonded to silicon for example, replacing hydrogen in Si—H having a bonding energy of about 3.18 eV. A more strongly bonded species is formed by fluorine bond replacement to form Si—F bonds which have a bonding energy of about 5.73 eV. The Si—F Bond is stronger compared to Si—Si, and Si—O bonds as well. Consequently, the gate oxide is made more resistant to hot carrier induced damage (e.g., bond breakage) and damage already present is at least partially repaired. For example, it is known that plasma processes including gate etching tend to cause damage to the gate oxide by injection of energetic charge carriers across the gate oxide due to plasma charging processes taking place at the process wafer surface. According to the present invention, the ion implantation of fluorine during the gate etching process followed by thermally enhanced diffusion of fluorine to the $Si/SiO_2$ interface both repairs gate oxide damage by lowering an interface defect density and makes the interface more resistant to further damage in subsequent processes where energetic charge carriers are produced thereby improving device performance and reliability.

Although not shown, conventional processes are then carried out including ion implantation steps to form the drain and source regions including, for example, a voltage threshold adjustment blanket ion implant of $BF_2$. In addition, oxide or nitride spacers along the gate structure sidewalls may be formed to aid the doping of the silicon substrate to form lightly doped drain (LDD) regions to minimize the hot carrier effect. Subsequently the gate oxide structure forms a portion of an NMOS or PMOS device included in an integrated circuit.

Thus according to the present invention a method has been presented which presents an improved method for hardening gate oxide layers while simultaneously repairing damaged gate oxides according to an easily implemented method that reduces the process time and cost of prior art processes. The present method additionally avoids problems associated with prior art ion implantation methods.

Figure 2:
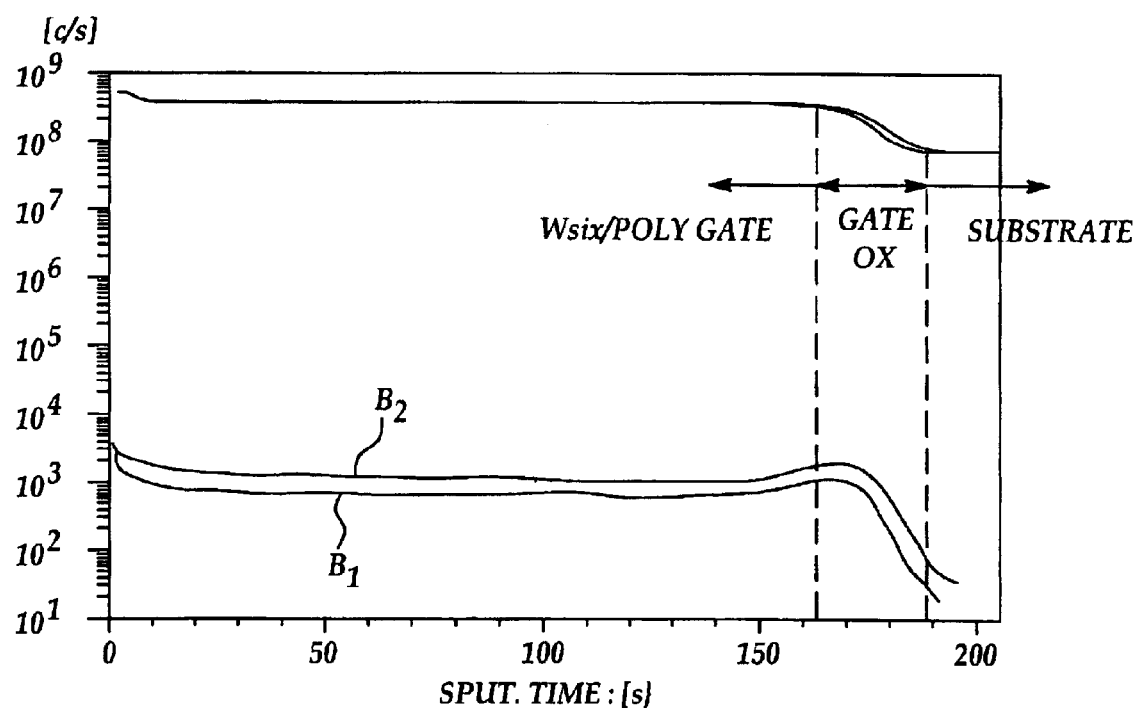
FIG. 2 is SIMS data representing fluorine concentrations over a gate structure produced with and without using the method according to an embodiment of the present invention.

Referring to FIG. 2 is shown data from a conventional secondary ion mass spectroscopy (SIMS) process where the gate structure is sequentially sputtered away and sputtered chemical species are detected and counted. Shown on the vertical axis are counts per second (c/s) proportional to a concentration of a chemical species in the sputtered material. The horizontal axis represents sputtering time where increasing time is proportional to a thickness through the sputtered target as the surface is gradually sputtered away. Shown to the left of line A1 is the portion of the gate structure including tungsten silicide layers and polysilicon layers. To the right of line A1 to line A2 the sputtering process corresponds to the gate oxide layer. To the right of line A2 the sputtering process corresponds to the silicon substrate. For clarity in presentation, only the fluorine detected by the SIMS process is shown. Line B1 represents a gate structure formed without the fluorine doping treatment of the gate oxide according to an embodiment of the present invention while line B2 represents a gate structure formed using the fluorine doping treatment (i.e., fluorine implant and thermally diffuse to gate oxide/silicon interface) of the gate oxide according to an embodiment of the present invention. Both wafer samples (e.g., lines B1 and B2) have undergone a voltage threshold blanket ion implant using $BF_2$ following formation of the gate structure. Consequently, line B1 without the fluorine doping treatment of the gate oxide represents a baseline concentration level of fluorine due to the $BF_2$ implant. It is clearly seen that line B2 following the fluorine doping treatment of the gate oxide according to an embodiment of the present invention has a significantly increased concentration of fluorine at the gate oxide/silicon interface.

Moreover, in a conventional reliability testing procedure the gate oxide is intentionally stressed with high voltages and a under a testing procedure known as charge to breakdown (QBD) to intentionally introduce defects into the gate oxide/silicon interface by hot carrier injection which leads to the breaking of bonds at the interface. The defect density is then determined by conventional processes. For example, it has been found that following the fluorine doping treatment of the gate oxide of the present invention that the defect density is reduced from about 25 percent to about 40 percent following the QBD process thereby verifying the increased resistance of the gate oxide following the fluorine doping treatment of the gate oxide.

Figure 3:
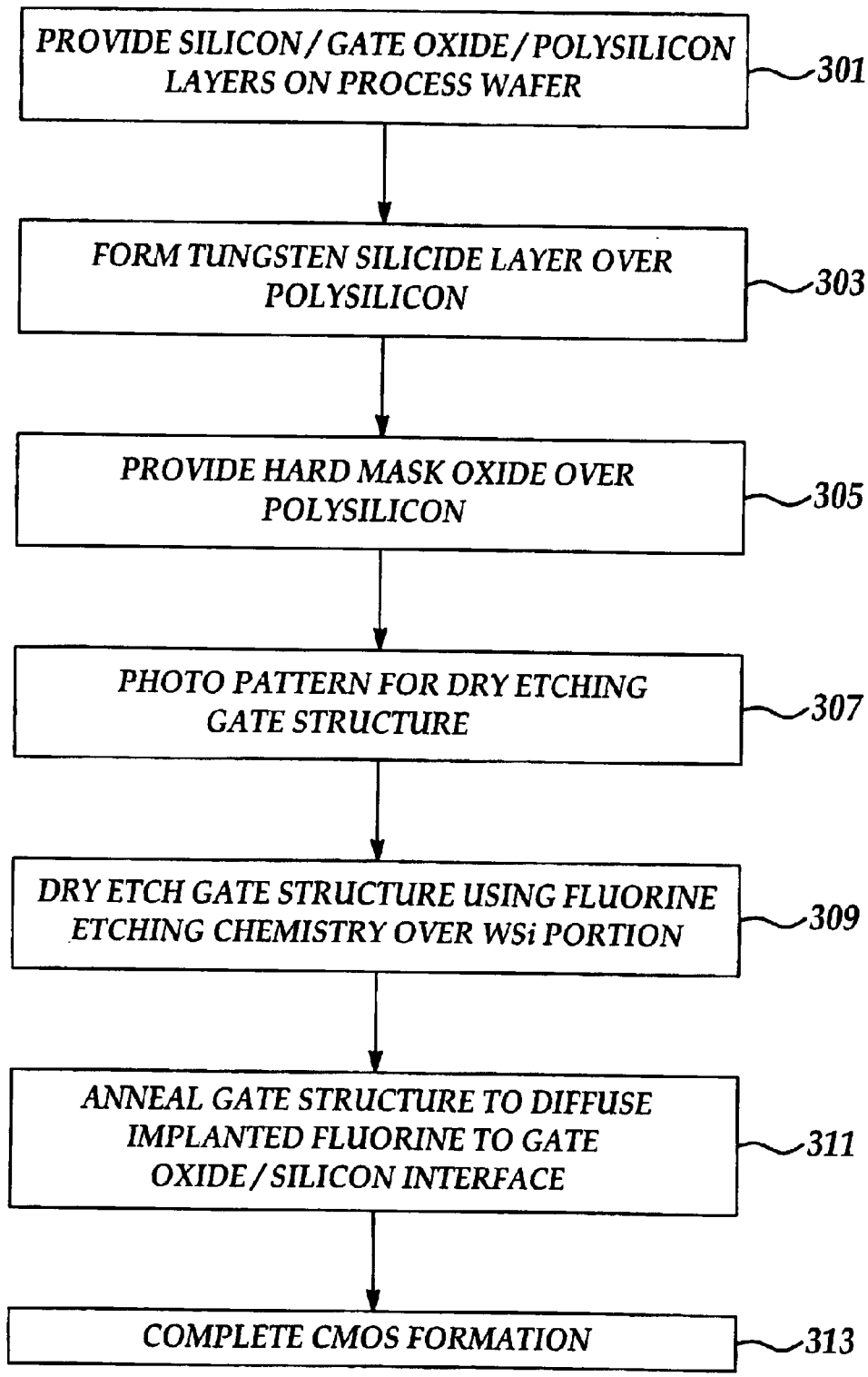
FIG. 3 is a process flow diagram including several embodiments of the present invention.

Referring to FIG. 3 is a process flow diagram including several embodiments of the present invention. In a first process 301 a gate oxide is provided over the silicon substrate and a polysilicon layer over the gate oxide. In process 303 a polycide, preferably a tungsten silicide layer is formed over the polysilicon layer. In process 305 a hard mask oxide or nitride layer is formed and photolithographically patterned for dry etching a gate structure. In process 307, the gate structure is photolithographically patterned for etching a gate structure. In process 309, a dry etching process to form the gate structure is carried out using a fluorine containing etching chemistry for etching through at least a portion of the polycide layer, preferably tungsten silicide, to implant fluorine in the exposed polycide layer sidewalls. In process 311, an annealing process is carried out to thermally diffuse the implanted fluorine atoms to the silicon/gate oxide interface to repair dangling bonds and to provide increased resistance to hot carrier induced damage. In process 313, the CMOS device is completed including additional ion implants.

While the embodiments illustrated in the Figures and described above are presently preferred, it should be understood that these embodiments are offered by way of example only. The invention is not limited to a particular embodiment, but extends to various modification, combinations, and permutations as will occur to the ordinarily skilled artisan that nevertheless fall within the scope of the appended claims.

What is claimed is:

1. A method for repairing a damaged gate oxide layer while improving a gate oxide layer resistance to gate oxide degradation comprising the steps of:

providing a silicon substrate having an overlying gate oxide layer and a polysilicon layer overlying the gate oxide layer;

forming a polycide layer over the polysilicon layer;

photolithographically patterning the polycide layer for dry etching a gate structure;

dry etching a gate structure including etching through a thickness of the polycide layer including a fluorine and chlorine containing etching chemistry to produce implanted fluorine in the polycide layer; and, thermally annealing the silicon substrate including the gate structure to thermally diffuse the implanted fluorine to an interface region of the gate oxide layer and the silicon substrate to repair defects and improve a gate oxide layer resistance to degradation.

2. The method of claim 1, wherein the gate oxide layer comprises a thermally grown silicon dioxide layer greater than about 50 Angstroms in thickness.

3. The method of claim 1, wherein the polycide layer comprises a refractory silicide selected from the group consisting of tungsten silicide, molybdenum silicide, and tantalum silicide.

4. The method of claim 1, wherein the polycide layer comprises tungsten silicide formed according to a CVD process.

5. The method of claim 1, wherein the fluorine and chlorine containing etching chemistry comprises a plasma forming gas mixture having a stoichiometric ratio of chlorine atoms to fluorine atoms of about 3 to 2 to about 2 to 1.

6. The method of claim 1, wherein the fluorine and chlorine containing etching chemistry comprises at least one fluorine containing gas selected from the group consisting of $CF_4$, $C_2F_6$, and $SF_6$.

7. The method of claim 1, wherein the fluorine and chlorine containing etching chemistry comprises at least one chlorine containing gas selected from the group consisting of $Cl_2$, $CCl_4$, $SiCl_4$, and $CHCl_3$.

8. The method of claim 1, wherein the step of thermally annealing includes a rapid thermal process (RTP) at a temperature of about 900 degrees Centigrade to about 1000 degrees Centigrade for a period of about 15 seconds to about 90 seconds.

9. The method of claim 1, wherein the steps of dry etching comprise plasma operating conditions comprising a pressure of about 1 milliTorr to about 20 milliTorr, an RF power of about 500 Watts to about 1500 Watts, and a silicon substrate temperature of about 50° C. to about 80° C.

10. The method of claim 1, wherein the fluorine portion of the fluorine and chlorine containing etching chemistry is limited to etching through a thickness portion of the polycide layer.

11. The method of claim 1, further including a blanket ion voltage threshold implant process of $BF_2$ following the step of thermally annealing.

12. A method for repairing lattice defect states at a gate oxide/silicon interface improving the gate oxide/silicon interface resistance to degradation comprising the steps of:

providing a silicon substrate having an overlying gate oxide layer and a polysilicon layer overlying the gate oxide layer;

forming a tungsten silicide layer over the polysilicon layer;

dry etching a gate structure including etching through a thickness portion of the tungsten silicide layer and polysilicon layer comprising a fluorine and chlorine containing etching chemistry to produce implanted fluorine in the tungsten silicide layer; and, thermally annealing the gate structure to drive the implanted fluorine through the polysilicon layer to an interface of the gate oxide layer and silicon substrate to improve a gate oxide resistance to degradation.

13. The method of claim 12, wherein the gate oxide layer comprises a thermally grown silicon dioxide layer greater than about 50 Angstroms in thickness.

14. The method of claim 12, wherein the tungsten silicide layer is formed having a thickness of about 1100 to about 1500 Angstroms.

15. The method of claim 12, wherein the tungsten silicide layer is formed according to a CVD process to produce a tungsten silicide chemical formulation $wsi_x$ where x has a value of from about 2.2 to about 2.6.

16. The method of claim 12, wherein the fluorine and chlorine containing etching chemistry comprises a plasma forming gas mixture having a stoichiometric ratio of chlorine atoms to fluorine atoms of about 3 to 2 to about 2 to 1.

17. The method of claim 12, wherein the fluorine and chlorine containing etching chemistry comprises at least one fluorine containing gas selected from the group consisting of $CF_4$, $C_2F_6$, and $SF_6$.

18. The method of claim 12, wherein the fluorine and chlorine containing etching chemistry comprises at least one chlorine containing gas selected from the group consisting of $Cl_2$, $CCl_4$, $SiCl_4$, and $CHCl_3$.

19. The method of claim 12, wherein the step of thermally annealing includes a rapid thermal process (RTP) at a temperature of about 900 degrees Centigrade to about 1000 degrees Centigrade for a period of about 15 seconds to about 45 seconds.

20. The method of claim 12, wherein the fluorine portion of the fluorine and chlorine containing etching chemistry is limited to etching through a thickness portion of the polycide layer.

* * * * *